(12) United States Patent
Murakawa et al.

(10) Patent No.: US 10,763,345 B2
(45) Date of Patent: Sep. 1, 2020

(54) SEMICONDUCTOR DEVICE

(71) Applicant: DENSO CORPORATION, Kariya, Aichi-pref. (JP)

(72) Inventors: Koichi Murakawa, Kariya (JP); Masakiyo Sumitomo, Kariya (JP); Shigeki Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/393,006

(22) Filed: Apr. 24, 2019

(65) Prior Publication Data

US 2019/0252534 A1 Aug. 15, 2019

Related U.S. Application Data

(63) Continuation of application No. PCT/JP2017/037893, filed on Oct. 19, 2017.

(30) Foreign Application Priority Data

Oct. 26, 2016 (JP) .................. 2016-209803

(51) Int. Cl.
| | |
|---|---|
| *H01L 29/739* | (2006.01) |
| *H01L 29/861* | (2006.01) |
| *H01L 29/06* | (2006.01) |
| *H01L 27/07* | (2006.01) |
| *H01L 29/10* | (2006.01) |
| *H01L 29/78* | (2006.01) |
| *H01L 29/868* | (2006.01) |

(52) U.S. Cl.
CPC ...... *H01L 29/7397* (2013.01); *H01L 27/0727* (2013.01); *H01L 27/0761* (2013.01); *H01L 29/0692* (2013.01); *H01L 29/1095* (2013.01); *H01L 29/739* (2013.01); *H01L 29/78* (2013.01); *H01L 29/861* (2013.01); *H01L 29/868* (2013.01)

(58) Field of Classification Search
None
See application file for complete search history.

(56) References Cited

U.S. PATENT DOCUMENTS

| | | | |
|---|---|---|---|
| 6,552,413 | B1 | 4/2003 | Hirano et al. |
| 2012/0132954 | A1 | 5/2012 | Kouno et al. |
| 2014/0048847 | A1 | 2/2014 | Yamashita et al. |
| 2015/0155277 | A1 | 6/2015 | Ogura et al. |
| 2016/0071841 | A1* | 3/2016 | Saito .................. H01L 29/4236 257/140 |

(Continued)

*Primary Examiner* — Alexander G Ghyka
(74) *Attorney, Agent, or Firm* — Posz Law Group, PLC

(57) ABSTRACT

In a semiconductor device, a boundary area is between an IGBT region and a diode region. In other words, the boundary region is at a position adjacent to the diode region. The boundary region has a lower ratio of formation of a high-concentration P-type layer than the IGBT region. Accordingly, during recovery, hole injection from the IGBT region to the diode region can be inhibited. The reduced ratio of formation of the high-concentration P-type layer in the boundary region also reduces the amount of hole injection from the high-concentration P-type layer of the boundary region. Thus, it inhibits an increase in maximum reverse current during the recovery, and also decreases the carrier density on the cathode side to inhibit an increase in tail electrical current, so that the semiconductor device reduces switching loss and is highly resistant to recovery destruction.

10 Claims, 10 Drawing Sheets

(56) References Cited

U.S. PATENT DOCUMENTS

| | | | |
|---|---|---|---|
| 2016/0079369 A1 | 3/2016 | Ogura et al. | |
| 2016/0247808 A1* | 8/2016 | Horiuchi | H01L 29/407 |
| 2017/0098700 A1 | 4/2017 | Yamashita et al. | |
| 2017/0141103 A1* | 5/2017 | Kameyama | H01L 29/78 |
| 2017/0263603 A1* | 9/2017 | Hata | H01L 27/0727 |
| 2018/0151557 A1* | 5/2018 | Tanabe | H01L 29/7397 |
| 2018/0197977 A1* | 7/2018 | Kouno | H01L 29/861 |
| 2018/0233554 A1* | 8/2018 | Mitsuzuka | H01L 27/0635 |
| 2018/0323294 A1* | 11/2018 | Okuda | H01L 29/4238 |
| 2018/0374947 A1* | 12/2018 | Yamashita | H01L 29/872 |

* cited by examiner

SEMICONDUCTOR DEVICE

CROSS REFERENCE TO RELATED APPLICATIONS

The present application is a continuation application of International Patent Application No. PCT/JP2017/037893 filed on Oct. 19, 2017, which designated the U.S. and claims the benefit of priority from Japanese Patent Application No. 2016-209803 filed on Oct. 26, 2016. The entire disclosures of all of the above applications are incorporated herein by reference.

TECHNICAL FIELD

The present disclosure relates to a semiconductor device having an insulated gate bipolar transistor (hereinafter, referred to as IGBT) region in which an IGBT is formed and a diode region in which a freewheeling diode (hereinafter, referred to as FWD) is formed.

BACKGROUND

A semiconductor device may have an RC-IGBT (abbreviation of reverse-conducting IGBT) structure including an IGBT and an FWD in one chip as, for example, a switching element of an inverter.

SUMMARY

The present disclosure describes a semiconductor device having an IGBT and a diode. The semiconductor device includes a semiconductor substrate, a trench gate structure, an emitter region, contact regions, and electrodes.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
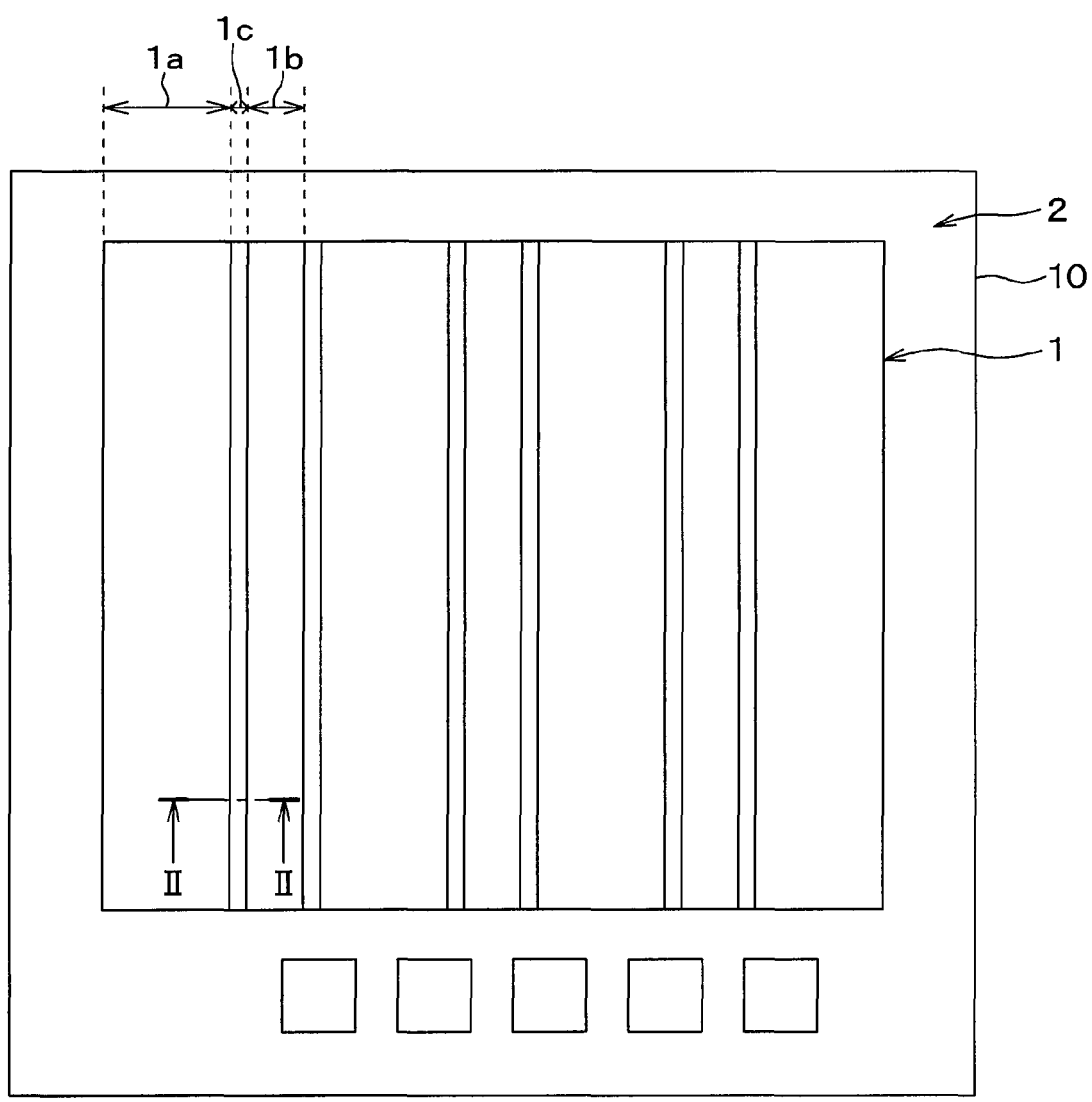
FIG. 1 is an upper surface layout diagram of a semiconductor device according to a first embodiment.

Reverse current that is transiently large flows during recovery operation in the RC-IGBT. Specifically at a boundary portion between an IGBT region and a diode region, holes are implanted from a P-type region of high concentration such as a channel formed on a surface side of the IGBT region toward a cathode layer of N-type formed on a back surface side of the diode region. This hole implantation causes increase of the maximum reverse current Irr during recovery, so that the implantation amount of holes is desired to be suppressed. To this end, in a semiconductor device, a second anode layer in which P-type impurity concentration is made constant is provided in a first anode layer in the diode region. By setting the P-type impurity concentration of the second anode layer to be high to some extent, latch-up is suppressed while by setting the P-type impurity concentration of the second anode layer not to be too high, the implantation amount of holes is suppressed to enable high speed switching to reduce switching loss.

However, in the structure as described above, the IGBT region and the diode region are adjacently arranged, so that hole implantation from a P-type region of high concentration such as a channel formed on a front surface side of the IGBT region cannot be sufficiently suppressed. Accordingly, switching loss cannot be sufficiently lowered. Furthermore, increase of carrier density on the cathode side results in increase of tail current, which can cause recovery destruction.

In one or more embodiments, a semiconductor device inhibits the injection of carriers from the IGBT region to the diode region during the recovery.

A semiconductor device according to an aspect of the present disclosure is configured by using a semiconductor substrate. The semiconductor substrate has an IGBT region having an IGBT, a diode region having a diode, and a boundary region between the IGBT region and the diode region. The semiconductor substrate includes: a first conductivity type drift layer; a second conductivity type base layer at a surface layer portion of the drift layer, the base layer having a first base layer in the IGBT region and a second base layer in the diode region and the boundary region; a second conductivity type collector layer arranged on a side of the drift layer opposite to a side of the base layer in the IGBT region and the boundary region; and a first conductivity type cathode layer arranged on the side of the drift layer opposite to the side of the base layer in the diode region.

A trench gate structure in which a gate insulating film and a gate electrode are arranged in a plurality of trenches is arranged in an IGBT region, a diode region, and a boundary region. A first conductivity type emitter region is arranged in at least a part of a first base layer to be in contact with any of the plurality of trenches. The first base layer is one of a plurality of portions of the base layer in the IGBT region divided by the trenches, and a first contact region is arranged at a portion of the first base layer different from the emitter region of the first base layer. A second conductivity type second contact region is arranged at a surface layer portion of a second base layer in the diode region and has a higher second conductivity type impurity concentration than the second base layer. The second base layer is the base layer in the diode region and the boundary region, and a second conductivity type third contact region is arranged at the surface layer portion of the second base layer in the boundary region and has a higher second conductivity type impurity concentration than the second base layer. An upper electrode is electrically connected to the first contact region, the second contact region, and the third contact region in addition to the emitter region, and a lower electrode is electrically connected to the collector layer and the cathode layer. In such a structure, formation area of the third contact region is smaller than a formation area of the second contact region per unit area of a surface of the semiconductor substrate.

In this manner, the boundary region whose formation rate of a high concentration second conductivity layer is smaller than that in the IGBT region is provided between the IGBT region and the diode region, that is, at a position adjacent to the diode region. This makes it possible to suppress carrier implantation into the diode region from the IGBT region during recovery as well as reduce carrier implantation amount from the high concentration second conductivity layer of the boundary region because formation rate of the high concentration second conductivity layer formed in the boundary region is small. This makes it possible to provide a semiconductor device capable of further suppressing implantation of carrier to the diode region side from the IGBT region side during recovery.

First Embodiment

A semiconductor device according to a first embodiment of the present disclosure will be described. The semiconductor device according to the present embodiment is formed by a RC-IGBT structure in which an IGBT of and a FWD of a vertical type that makes current flow in a thickness direction of a substrate are provided in one substrate. The semiconductor device is suitable for use as a power switching element used in a power source circuit such as an inverter or a DC/DC converter. Specifically, the semiconductor device according to the present embodiment is formed as described below.

As illustrated in FIG. 1, the semiconductor device includes a cell region 1, and an outer peripheral region 2 surrounding the cell region 1.

As illustrated in FIG. 1, FIG. 2, FIG. 3A, and FIG. 3B, in the cell region 1, an IGBT region 1a in which an IGBT element is formed and a diode region 1b in which an FWD is formed are alternately formed. A boundary region 1c is formed between the IGBT region 1a and the diode region 1b.

Figure 2:
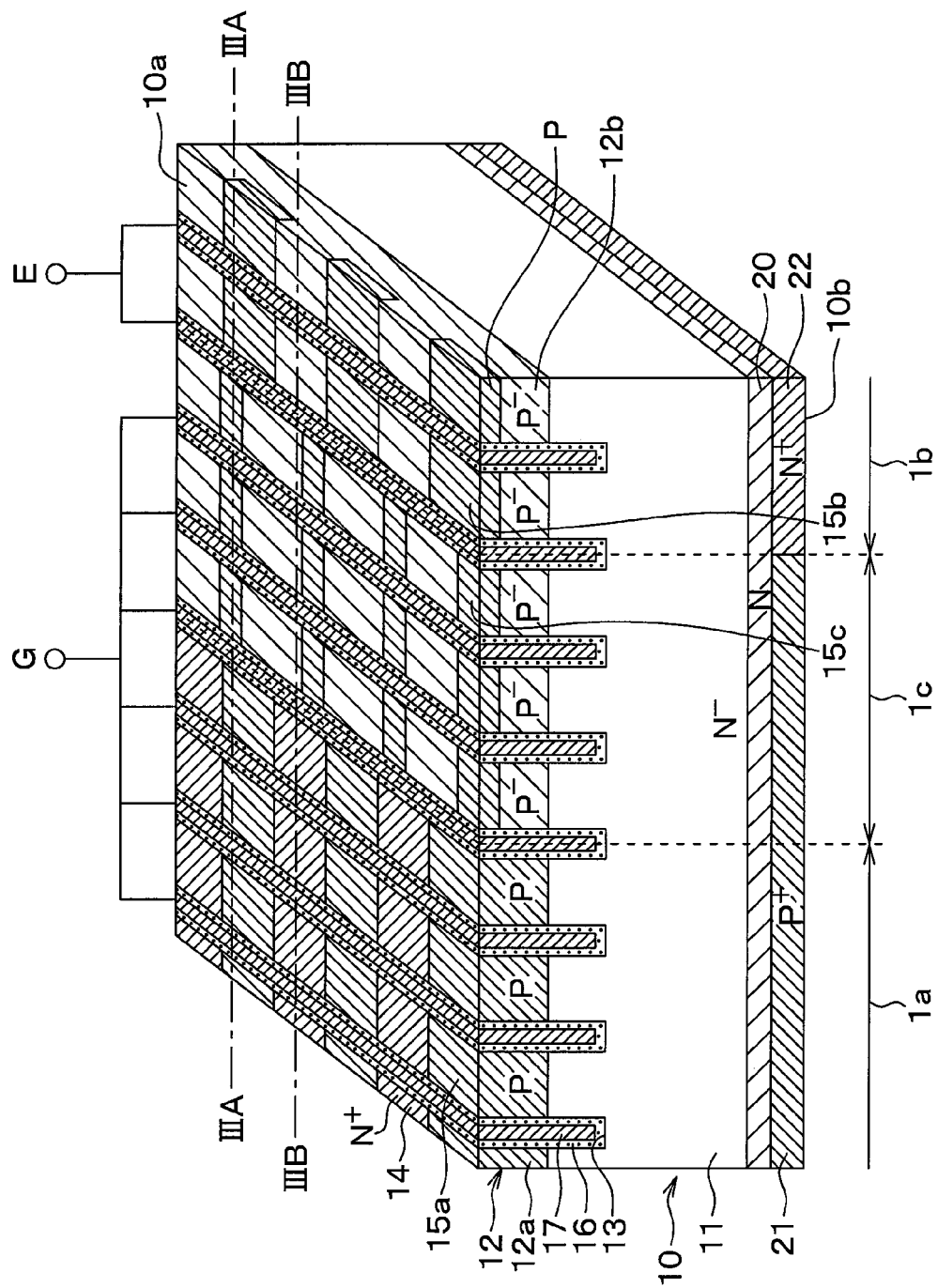
FIG. 2 is a perspective cross-sectional view of a semiconductor substrate taken along a line II-II of FIG. 1.
Figure 3A:
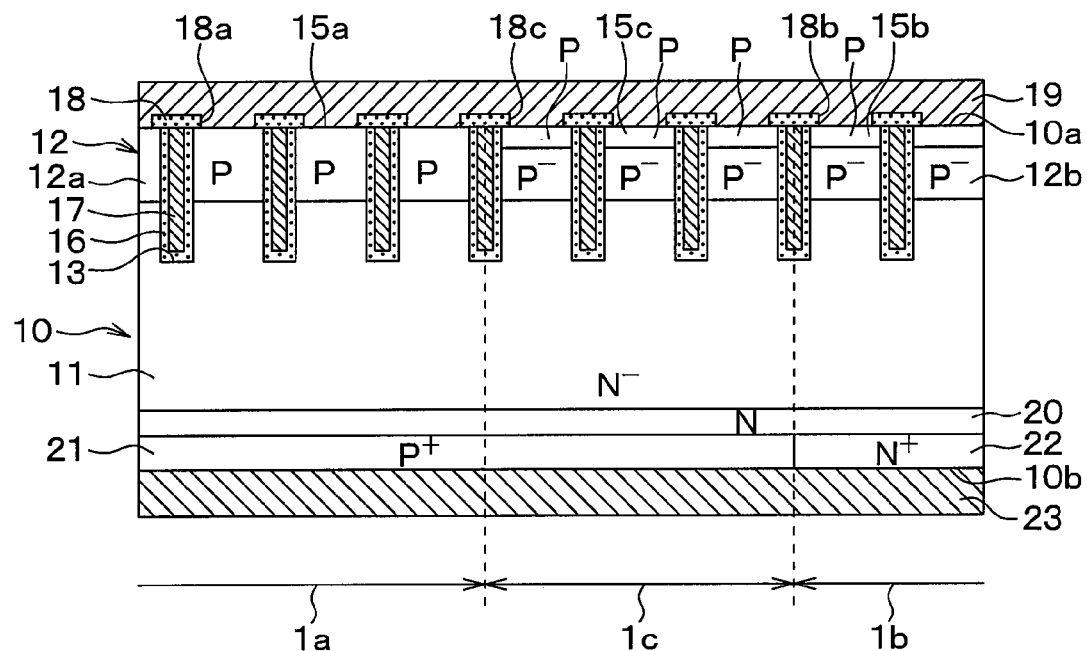
FIG. 3A is a cross-sectional view taken along a line IIIA-IIIA in FIG. 2.
Figure 3B:
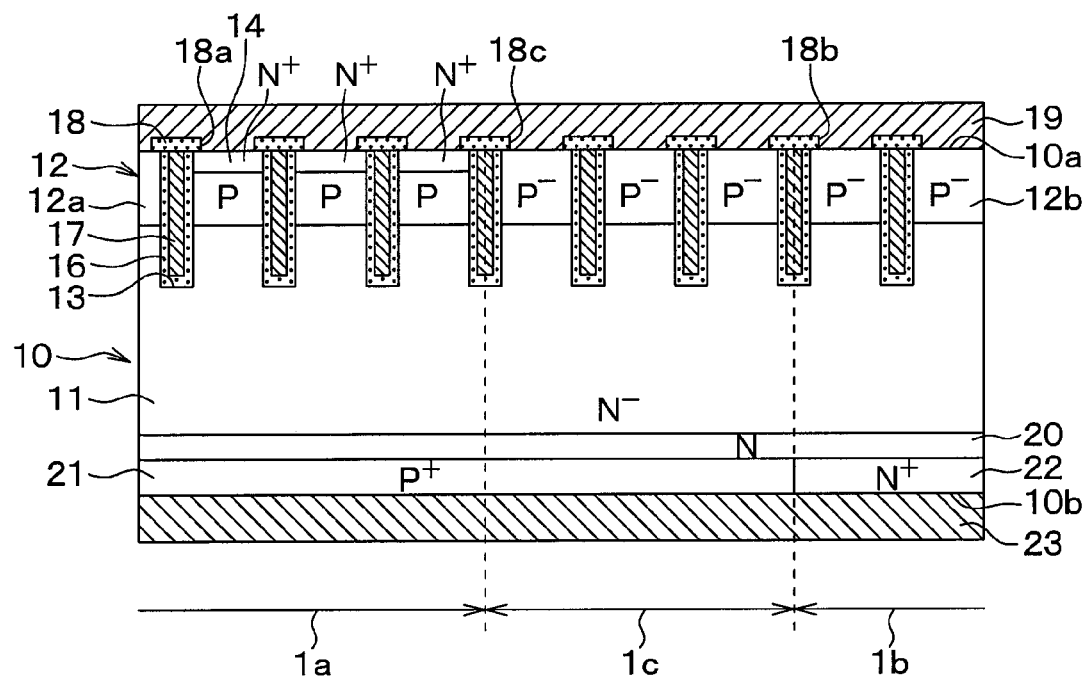
FIG. 3B is a cross-sectional view taken along a line IIIB-IIIB in FIG. 2.

Specifically, the IGBT region 1a, the diode region 1b, and the boundary region 1c are formed by one chip by being formed on a semiconductor substrate 10 of N⁻ type functioning as a drift layer 11 as illustrated in FIG. 2, FIG. 3A, and FIG. 3B. The IGBT region 1a, the diode region 1b, and the boundary region 1c are extended in one direction included in a first surface 10a of the semiconductor substrate 10, that is, a vertical direction when viewed on FIG. 1. The IGBT region 1a and the diode region 1b are alternately and repeatedly formed in a direction orthogonal to the extended direction, and the boundary region 1c is formed therebetween.

A base layer 12 of P-type is formed above the drift layer 11, that is, on a side of the first surface 10a of the semiconductor substrate 10. A plurality of trenches 13 are formed to penetrate the base layer 12 to reach the drift layer 11, and the base layer 12 is separated into a plural number by the trenches 13.

Note that, in the present embodiment, the plurality of trenches 13 are extended along one direction among surface directions of the first surface 10a of the semiconductor substrate 10, that is, along a depth direction in FIG. 2, and formed at regular intervals in right and left directions in the drawing. The first surface 10a of the semiconductor substrate 10 is formed by one side of the base layer 12 on a side opposite to the drift layer 11.

The base layer 12 is varied in its P-type impurity concentration among the IGBT region 1a, the diode region 1b, and the boundary region 1c, and P-type impurity concentration is set higher in the IGBT region 1a as compared with the diode region 1b the boundary region 1c. Hereinafter, the base layer 12 formed in the IGBT region 1a is referred to as a first base layer 12a, and the base layer 12 formed in the diode region 1b and the boundary region 1c is referred to as a second base layer 12b.

The first base layer 12a functions as a channel region and also functions as a body region. An emitter region 14 of N⁺ type partially made shallower than the first base layer 12a in depth is formed on the surface layer portion of the first base layer 12a as illustrated in FIG. 2 and FIG. 3B.

The emitter region 14 is formed to have a high impurity concentration than that in the drift layer 11, and formed to be terminated in the first base layer 12a and be in contact with a side surface of the trench 13. In the case of the present embodiment, a plurality of the emitter region 14 is interspersed between every two adjacent trenches 13 at regular intervals along a longitudinal direction of the trench 13. In other words, the emitter regions 14 are extended to cross, to be more specific, and so as to be orthogonal to the longitudinal direction of the plurality of the trenches 13 when viewed from the normal direction with respect to the first surface 10a of the semiconductor substrate 10. Each emitter region 14 positioned between corresponding two of the plurality of trenches 13 is in contact with a side surface of each of the adjacent trenches 13.

Although the emitter regions 14 adjacent with each other are linear when connected in the perpendicular direction with respect to the longitudinal direction of the plurality of trenches 13, they are segmentalized by trenches 13, making each emitter region 14 have a rectangular shape. Each emitter region 14 is disposed inside both ends in the longitudinal direction of the trenches 13.

The first base layer 12a is formed to reach the side of the first surface 10a of the semiconductor substrate 10 at a portion where no emitter region 14 is formed, and the portion is defined as a first contact region 15a brought into ohmic contact with an upper electrode 19 described below. The width of the first contact region 15a in the longitudinal direction of the trench 13 is made equal to, for example, the width of the emitter region 14 in the longitudinal direction, and the area ratio thereof are made to be 1:1.

The first contact region 15a is formed by a part of the first base layer 12a, but it may be an area partially set higher in surface density. In the case of the present embodiment, the first contact region 15a is made to have an upper surface layout like the emitter region 14 when viewed from the normal direction with respect to the first surface 10a of the semiconductor substrate 10, and a portion excluding the emitter region 14 is defined as the first contact region 15a. That is, the first contact region 15a is extended to cross, more specifically, so as to be orthogonal to the longitudinal direction of the plurality of trenches 13, and each first contact region 15a positioned between corresponding two of the plurality of trenches 13 is in contact with a side surface of each of the adjacent trenches 13.

Although the first contact regions 15a adjacent with each other are linear when connected in the perpendicular direction with respect to the longitudinal direction of the plurality of trenches 13, they are segmentalized by trenches 13, making each first contact region 15a have a rectangular shape.

The second base layer 12b is an anode layer functioning as a part of an anode in the diode region 1b. Although no emitter region 14 is formed in the second base layer 12 in the diode region 1b like in the IGBT region 1a, a second contact region 15b is formed set higher than the second base layer 12b in P-type impurity concentration and brought into ohmic contact with the upper electrode 19 described below. In the case of the present embodiment, a plurality of the second contact regions 15b is interspersed along the longitudinal direction of the trenches 13. In other words, the second contract region 15b is extended to cross, more specifically, so as to be orthogonal to the longitudinal direction of the plurality of trenches 13 when viewed from the normal direction with respect to the first surface 10a of the semiconductor substrate 10. Each second contact region 15b positioned between corresponding two of the plurality of trenches 13 is in contact with a side surface of the adjacent trenches 13. The depth of each second contact region 15b is made shallower than that of the second base layer 12b. A width of each second contact region 15b, that is, a size in the same direction as the longitudinal direction of the trenches 13 is optional, but the width is made equal to that of the first contact region 15a in the case of the present embodiment. In this case, the area ration between the second contact region 15b and a portion of the second base layer 12b where no second contact region 15b is formed becomes 1:1.

Furthermore, the second base layer 12b of the boundary region 1c becomes a portion forming a boundary between the IGBT region 1a and the diode region 1b, so that it does not need to function specifically. However, formation of the boundary region 1c can decrease energization amount per unit area to increase of on-voltage Von, thereby increasing on-resistance. To suppress increase of on-resistance, in the present embodiment, the second base layer 12b in the boundary region 1c is made to function as a hole passage layer during operation of the IGBT. This will be described below.

Also in the second base layer 12b in the boundary region 1c, a third contact region 15c is formed which is set higher than the second base layer 12b in P-type impurity concentration and brought into ohmic contact with the upper region 19 described below. In the case of the present embodiment, a plurality of the third contact regions 15c is interspersed along the longitudinal direction of the trenches 13. In other words, the third contact region 15c is extended to cross, more specifically, so as to be orthogonal to the longitudinal direction of the plurality of trenches 13 when viewed from the normal direction with respect to the first surface 10a of the semiconductor substrate 10. Each third contact region 15c positioned between corresponding two of the plurality of trenches 13 is in contact with a side surface of the trenches 13 adjacent with each other. A depth of each third contact region 15c is made to be equal to the depth of the second contact region 15b. A width of each third contact region 15c, that is, a size thereof in the same direction as the longitudinal direction of the trenches 13 is optional, but the width is made narrower than the width of the second contact region 15b. For example, herein, the size of the third contact region 15c is set such that the area ratio between the third contact region 15c and a portion of the second base layer 12b where no third contact region 15c is formed is set to be 1:2.

In this manner, in the diode region 1b and the boundary region 1c, the second contact region 15b and the third contact region 15c are respectively formed. By changing formation area of the second contact region 15b and the third contact region 15c, the formation ratio of high concentration P-type layer per unit area and the ohmic contact area ratio are changed. Herein, the third contact region 15c has a width narrower than that of the second contact region 15b, so that the formation ratio of high concentration P-type layer per unit area and the ohmic contact area ratio of the boundary region 1c are made smaller than those in the diode region 1b. The second base layer 12b in the boundary region 1c is lower than the first base layer 12a formed in the IGBT region 1a in P-type impurity concentration, and the width of the third contact region 15c is also made narrower than the width of the first base layer 12a. Accordingly, the formation ratio of high concentration P-type layer per unit area and the ohmic contact area ratio in the boundary region 1c are made smaller than those in the IGBT region 1a.

In each trench 13, a gate insulating film 16 formed to cover an inside wall surface of each trench 13, and a gate electrode 17 formed of polysilicon or the like formed on the gate insulating film 16 are embedded. This forms a trench gate structure.

The gate electrode 17 is controlled to have a desired gate voltage in the IGBT region 1a, and emitter-connected in the diode region 1b. This forms, in the IGBT region 1a, a channel on a side surface of the trench 13 when a high level voltage as a gate voltage for operating the IGBT is applied. In the diode region 1b, the gate electrode 17 is made to be in an emitter electrical potential, which forms no channel also during operation of the IGBT, and a predetermined FWD operation is performed.

In the present embodiment, the gate electrode 17 in the boundary region 1c is made to be in the same electrical potential as that of the gate electrode 17 in the IGBT region 1a, and controlled to have a desired gate voltage. Accordingly, also in the boundary region 1c, a channel is formed on a side surface of the trench 13, which makes holes readily flow by passing through the channel as well as holes attracted on the channel side also flow via the second base layer 12b. Accordingly, as described above, in the boundary region 1c, the second base layer 12b functions as a hole passage layer, making it possible to suppress decrease of energization amount per unit area due to existence of the boundary region 1c. This makes it possible to suppress increase of on-voltage Von to suppress increase of on-resistance.

Furthermore, as illustrated in FIG. 3A and FIG. 3B, on the side of the first surface 10a of the semiconductor substrate 10, an interlayer insulating film 18 formed of a BPSG or the like is formed on the base layer 12. In the interlayer insulating film 18, a contact hole 18a that makes a part of the emitter region 14 and the first contact region 15a exposed is formed in the IGBT region 1a. In the interlayer insulating film 18, contact holes 18b, 18c that make the second base layer 12b, the second contact region 15b, and the third contact region 15c exposed are also formed in the diode region 1b and the boundary region 1c.

The upper electrode 19 is formed on the interlayer insulating film 18. The upper electrode 19 is electrically connected to the emitter region 14 and the first contact region 15a via the contact hole 18 in the IGBT region 1a. The upper electrode 19 is electrically connected to the second base layer 12b, the second contact region 15b, and the third contact region 15c via the contact holes 18b, 18c in the diode region 1b and the boundary region 1c. That is, the upper electrode 19 functions as an emitter electrode in the IGBT region 1a, and functions as an anode electrode in the diode region 1b. The upper electrode 19 specifically does not need to function in the boundary region 1c, but as described above, functions as a hole pull out electrode because the gate electrode 17 is controlled to have a gate voltage like in the IGBT region 1a in the boundary region 1c in the present embodiment.

In the diode region 1b and the boundary region 1c, the upper electrode 19 is brought into ohmic contact with the second contact region 15b and the third contact region 15c, and brought into schottky contact with the second base layer 12b. Accordingly, the ohmic contact area ratio is stepwisely changed between the boundary region 1c adjacent to the IGBT region 1a and the diode region 1b further away therefrom. That is, a layout is made from the IGBT region 1a to the diode region 1b via the boundary region 1c where the ohmic contact area ratio is small.

In contrast, a field stop (hereinafter, referred to as FS) layer 20 whose N-type impurity concentration is set higher than that in the drift layer 11 is formed on a side opposite to a side of the base layer 12 of the drift layer 11, that is, on the side of the second surface 10b of the semiconductor substrate 10 of the drift layer 11. The FS layer 20 is not necessarily needed, but is provided to improve pressure resistance and performance of steady loss by preventing spread of a depletion layer as well as control implantation amount of holes implanted from the side of the second surface 10b of the semiconductor substrate 10.

A collector layer 21 of P-type is formed on a side opposite to the drift layer 11 to sandwich the FS layer 20 in the IGBT region 1a and the boundary region 1c, and a cathode layer 22 of N-type is formed on a side opposite to the drift layer 11 to sandwich the FS layer 20 in the diode region 1b. That is, in the present embodiment, the IGBT region 1a and the boundary region 1c, and the diode region 1b are separated depending on whether the layer formed on the side of the second surface 10b of the semiconductor substrate 10 is the collector layer 21 or the cathode layer 22.

In the other surface 10a of the semiconductor substrate 10, a lower electrode 23 is formed on a surface of the collector layer 21 or the cathode layer. The lower electrode 23 functions as a collector electrode in the IGBT region 1a and the boundary region 1c, and functions as a cathode electrode in the diode region 1b.

Such a structure forms, in the IGBT region 1a, an IGBT element in which the first base layer 12a is its base, the emitter region 14 is its emitter, and the collector layer 21 is its collector. Such a structure also forms, in the diode region 1b, a PN jointed FWD element in which the second base layer 12b and the second contact region 15b are its anode, and the drift layer 11 and the cathode layer 22 are its cathode.

Operation and effect of the semiconductor device including the IGBT element and the FWD element configured above will be described.

The semiconductor device of the present embodiment performs on-off operation by control of application voltage with respect to the gate electrode 17, that is, switching operation that makes current flow between the emitter and the collector or be cut off like in the conventional semiconductor device as to the IGBT formed in the IGBT region 1a. The semiconductor device suppresses surge during switching by diode operation in association with switching operation of the IGBT as to the FWD formed in the diode region 1b.

Figure 4:
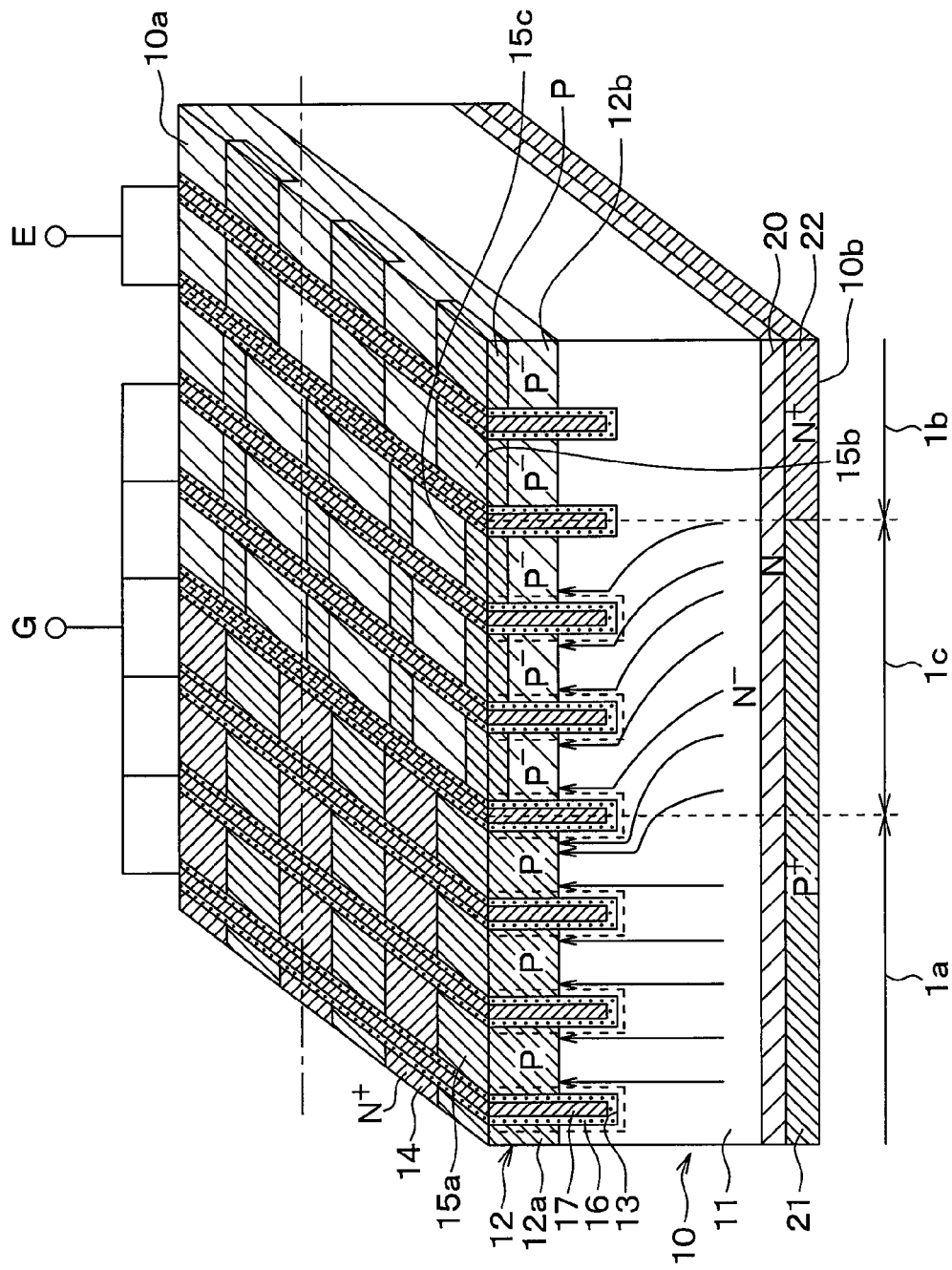
FIG. 4 is a diagram illustrating flow of holes during operation of an IGBT of the semiconductor device according to the first embodiment.

When such an operation is performed, during when the IGBT is on, the gate electrode 17 in the boundary region 1c is also controlled at a gate voltage like in the IGBT region 1a, so that a channel is formed on a side surface of the trench 13 in the boundary region 1c as illustrated in FIG. 4. Accordingly, also in the boundary region 1c, a channel is formed on a side surface of the trench 13, which makes holes readily flow by passing through the channel as well as holes attracted on the channel side also flow via the second base layer 12b. Accordingly, in the boundary region 1c, the second base layer 12b functions as a hole passage layer, and reduction of energization amount per unit area due to existence of the boundary region 1c can be suppressed, making it possible to suppress increase of on-voltage Von to suppress increase of on-resistance.

Furthermore, supposing that formation ratio of the high concentration P-type layer on the side of the first surface 10a of the semiconductor substrate 10 is large at a position adjacent to the diode region 1b, implantation amount of holes that travels from the high concentration P-type layer to the cathode becomes large at the time of recovery when IGBT is switched from off to on. This invites increase of the maximum reverse current Irr during recovery. Increase of carrier density on the cathode side can also disadvantageously increase tail current to invite recovery destruction.

However, in the semiconductor device of the present embodiment, the boundary region 1c whose formation rate of high concentration P-type layer is smaller than that in the IGBT region 1a is formed between the IGBT region 1a and the diode region 1b, that is, at a position adjacent to the diode region 1b. This makes it possible to, during recovery, suppress hole implantation from the IGBT region 1a to the diode region 1b as well as reduce a hole implantation amount from the high concentration P-type layer in the boundary region 1c because the formation rate of the high concentration P-type layer formed in the boundary region 1c is small. This makes it possible to suppress increase of the maximum reverse current Irr during recovery as well as suppress increase of tail current by making carrier density on the cathode side low. This makes it possible to provide a semiconductor device that can not only reduce switching loss but also have high resistance characteristics with respect to recovery destruction.

Figure 5:
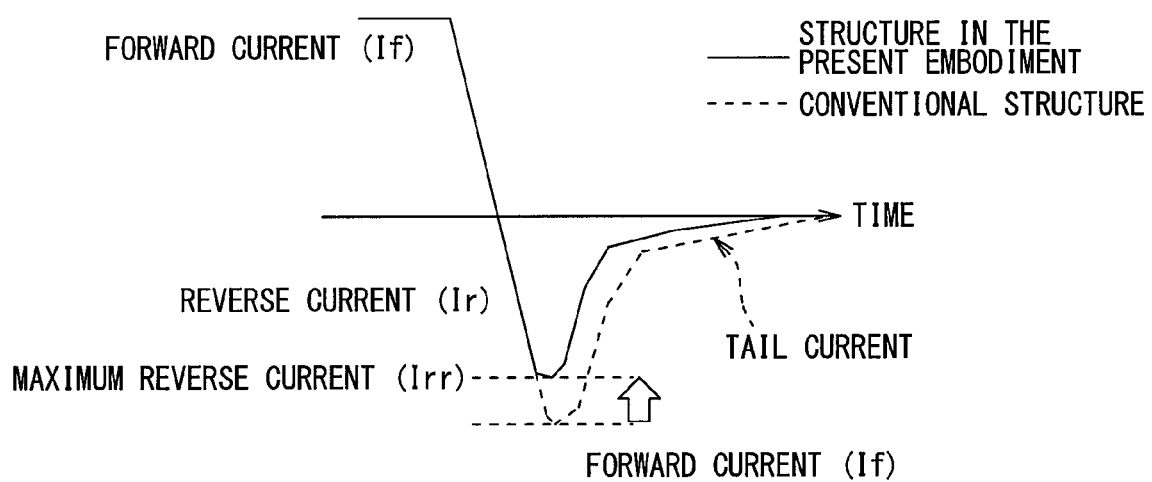
FIG. 5 is a diagram illustrating reverse current characteristics of the semiconductor device according to the first embodiment and a semiconductor device having a conventional structure.

Specifically, examining the maximum reverse current Irr in the semiconductor devices of the conventional structure and the structure of the present embodiment yields the results illustrated in FIG. 5. As compared with a case of the conventional structure illustrated by a broken line in the drawing, the maximum reverse current Irr can be lowered in the case of the structure of the present embodiment illustrated by a solid line in the drawing. Since an integral value of the reverse current Irr in the drawing, that is, an area of the region where the current value becomes negative corresponds to recovery loss Err; reduction of recovery loss Err becomes possible by making the maximum reverse current Irr low.

In the present embodiment, lifetime killer by He beam irradiation or electron beam irradiation is not generated. Although lifetime killer is typically generated in the past since recovery loss Err can be reduced, He beam irradiation or electron beam irradiation is difficult to be separated out at appropriate positions, resulting in property deterioration of another element. In order to eliminate the generation of lifetime killer by He beam irradiation or electron beam irradiation, taking a measure of reducing impurity concentration of the drift layer 11 and the base layer 12 can be employed. However, reducing impurity concentration increases an impurity concentration difference at PN junction with a high concentration region where impurity concentration is made high by that much, disadvantageously increasing tail current or inviting recovery destruction.

In contrast, providing the boundary region 1c having the above structure like the semiconductor device of the present embodiment enables to suppress hole implantation from the IGBT region 1a to the diode region 1b during recovery, making it possible to reduce impurity concentration in the drift layer 11 and the base layer 12. This can make it unnecessary to generate lifetime killer by He beam irradiation and electron beam irradiation, making it possible to suppress deterioration of properties of another element.

Second Embodiment

A second embodiment will be described. The present embodiment is a modification in which the connection mode of the gate electrode 17 in the boundary region 1c is changed from the first embodiment, and similar to the first embodiment excluding the change, so that only portions different from those in the first embodiment will be described.

Figure 6:
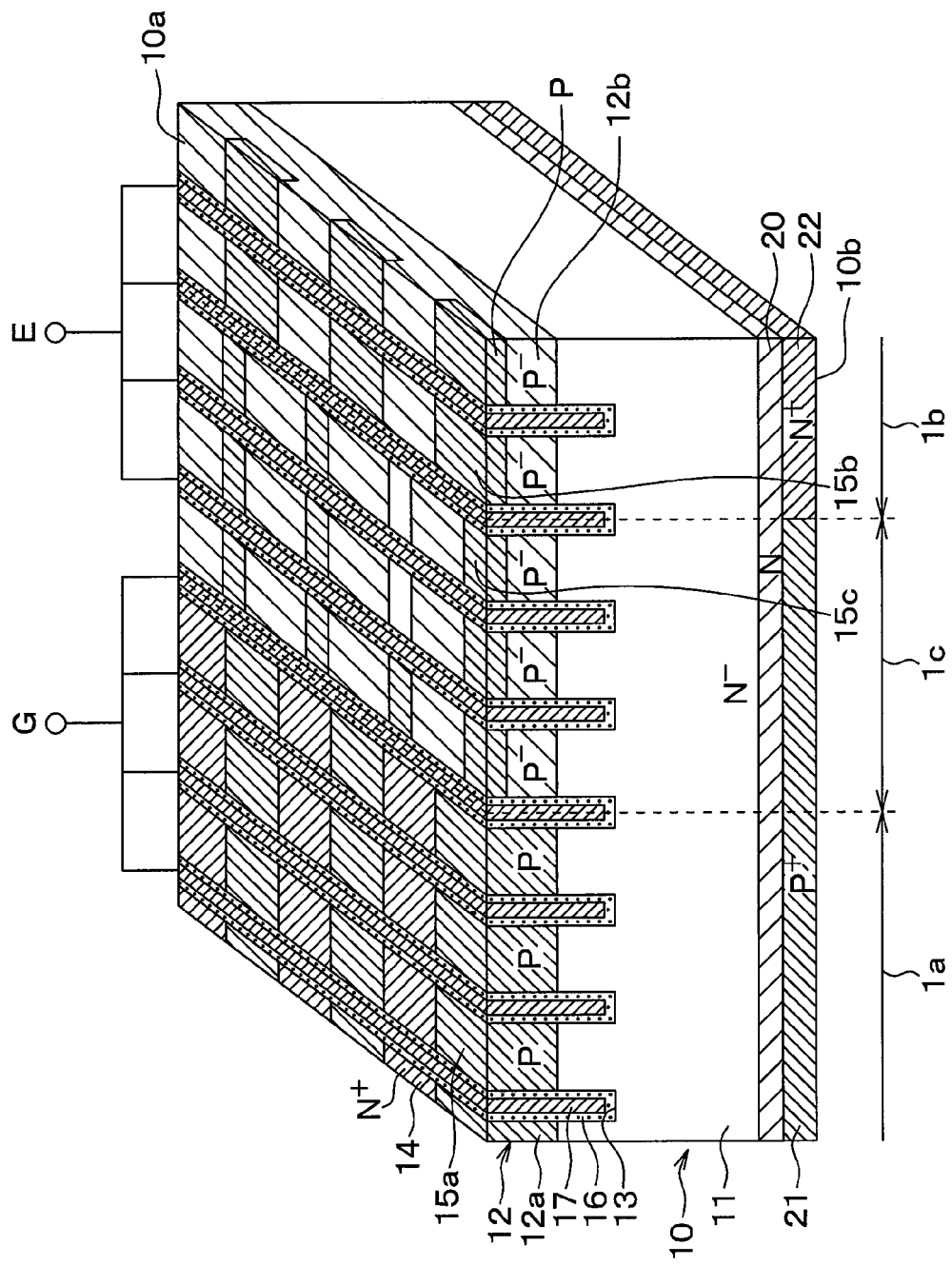
FIG. 6 is a perspective cross-sectional view of a semiconductor substrate composing a semiconductor device according to a second embodiment.

As illustrated in FIG. 6, in the present embodiment, the gate electrode 17 in the boundary region 1c is made to be in emitter connection like the gate electrode 17 in the diode region 1b. In this manner, when the gate electrode 17 of the boundary region 1c is emitter-connected, no channel is formed on a side surface of the trench 13 in the boundary region 1c when the IGBT is turned on, reducing passage amount of hole passing through the boundary region 1c. This fails to yield increase suppression effect of on-voltage Von and reduction effect of on-resistance, but yields the effects similar to those in the first embodiment excluding them.

Third Embodiment

A third embodiment will be described. The present embodiment is a modification in which the upper surface layout of each part is changed from the first embodiment, and similar to the first embodiment except the change, so that only portions different from those in the first embodiment will be described.

Figure 7:
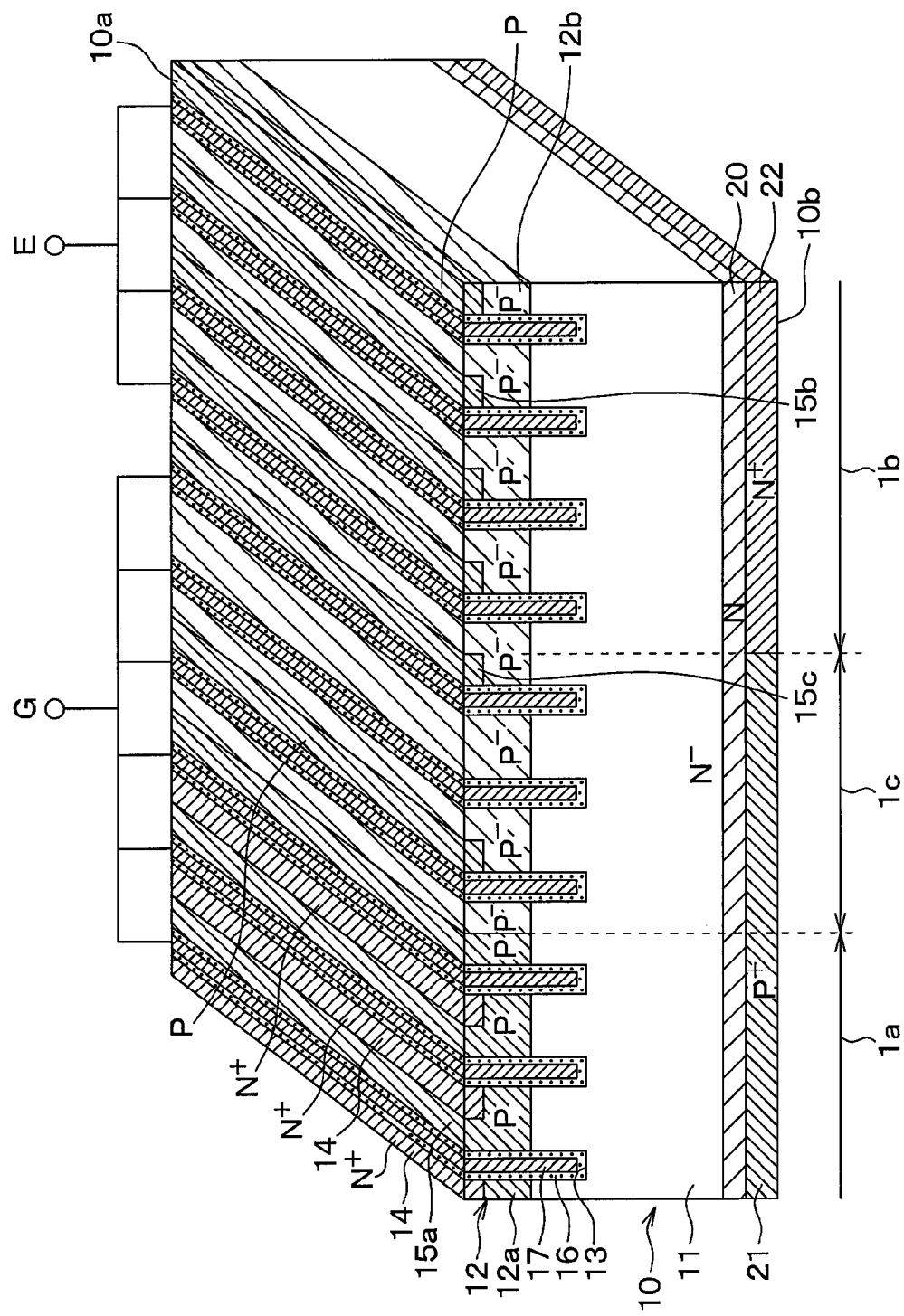
FIG. 7 is a perspective cross-sectional view of a semiconductor substrate composing a semiconductor device according to a third embodiment.

As illustrated in FIG. 7, the emitter region 14 is laid out in a linear manner along the longitudinal direction of the trenches 13. Herein, although the emitter region 14 is arranged on one side surface of the trench 13, specifically on a left side surface of the trench 13 in the drawing, the emitter region 14 may be arranged on both side surfaces of the trench 13. Since the emitter region 14 is made to be linear, the first contact region 15a is also laid out in a linear manner with this change.

The same applies to the diode region 1b and the boundary region 1c, so that the second contact region 15b and the third contact region 15c are laid out in a linear manner along the longitudinal direction of the trench 13. In the case of the present embodiment, the second contact region 15b and the third contact region 15c are arranged only on one side surface of the trench 13, specifically on a right side surface in the drawing that becomes a side surface opposite to the side surface on which the emitter region 14 is formed. However, this is also an example, and the second contact region 15b and the third contact region 15c may be arranged on both side surfaces or may be arranged at a position away from the trench 13. Because the second contact region 15b and the third contact region 15c are made to be linear, a portion brought into schottky contact with the upper electrode 19 of the second base layer 12b is also laid out in a linear manner with this change.

Also in the present embodiment, the formation area of the second contact region 15b and the third contact region 15c, that is, the formation ratio of high concentration P-type layer per unit area and the ohmic contact ratio are changed between the diode region 1b and the boundary region 1c.

In the case of the present embodiment, the second contact region 15b is formed in every second base layer 12b between corresponding two of the plurality of trenches 13 in the diode region 1b. In contrast, in the boundary region 1c, the third contact region 15c is not formed for every second base layer 12b between corresponding two of the plurality of trenches 13, but the third contact region 15c is formed for every plural number of, in the drawing, for every two of the second base layers 12b.

In this manner, in addition to the emitter region 14 and the first contact region 15a, the second contact region 15b and the third contact region 15c can also be laid out in a linear manner. Such a structure also makes it possible to yield the similar advantageous effects as those in the first embodiment.

Herein, although all the first contact region 15a, the second contact region 15b, and the third contact region 15c are linearly formed with the same width, widths thereof may be different. In the boundary region 1c, the third contact region 15c may be formed in each of the second base layers 12b between corresponding two of the plurality of trenches 13 as well as make the width of the third contact region 15c smaller than that of the second contact region 15b formed in the diode region 1b.

Figure 8:
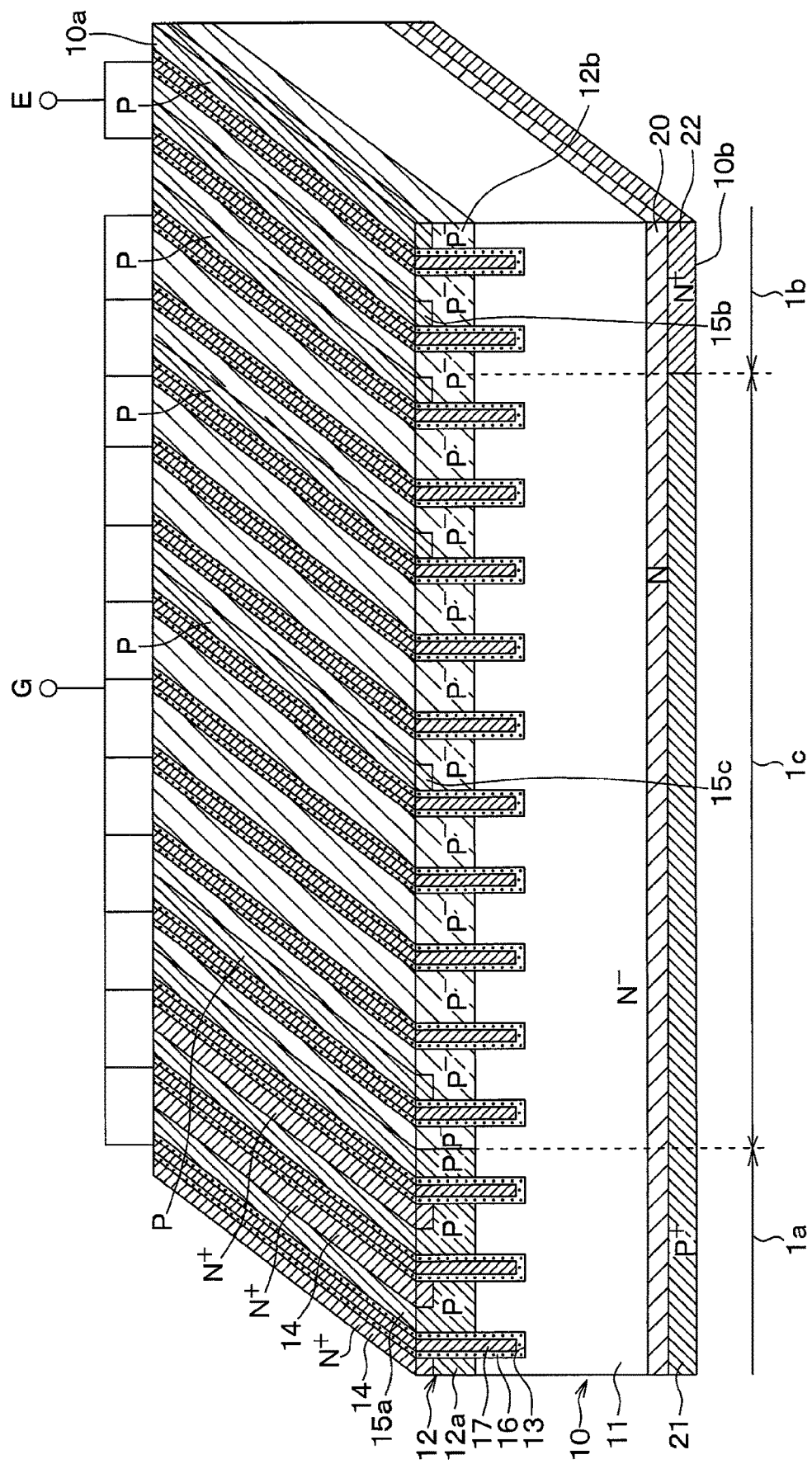
FIG. 8 is a perspective cross-sectional view of a semiconductor substrate composing a semiconductor device according to a modification of the third embodiment.

Also in the boundary region 1c, the formation area of the third contact region 15c can be stepwisely changed. For example, as illustrated in FIG. 8, a formation pitch that is intervals at which the third contact regions 15c are formed may be gradually decreased from the IGBT region 1a toward the diode region 1b. This makes it possible to make the formation area of the third contact region 15c on the side of IGBT region 1a smaller than the formation area on the side of the diode region 1b.

Stepwisely changing the formation area of the third contact region 15c makes it possible to adjust tradeoff relationship between forward voltage drop Vf and recovery loss Err of the FWD. For example, increasing the pitch of the third contact regions 15c increases the forward voltage drop Vf, making it possible to reduce recovery loss Err. In contrast, reducing the pitch of the third contact regions 15c decreases the forward voltage drop Vf, increasing the recovery loss Err. Accordingly, setting the pitch of the third contact regions 15c depending on desired properties makes it possible to adjust the relation of tradeoff between the forward voltage drop Vf and the recovery loss Err to be a desired relation.

Fourth Embodiment

A fourth embodiment will be described. The present embodiment is a modification in which the structure on the side of the second surface 10b in the diode region 1b and the boundary region 1c is changed from the first to third embodiments, and other structures are same as those in the first to third embodiments, so that only the portions different from those in the first to third embodiments will be described. Although a case where the structure on the side of the second surface 10b is changed from the structure of the first embodiment is described herein, the change is also applicable to the structures of the second and the third embodiments.

Figure 9:
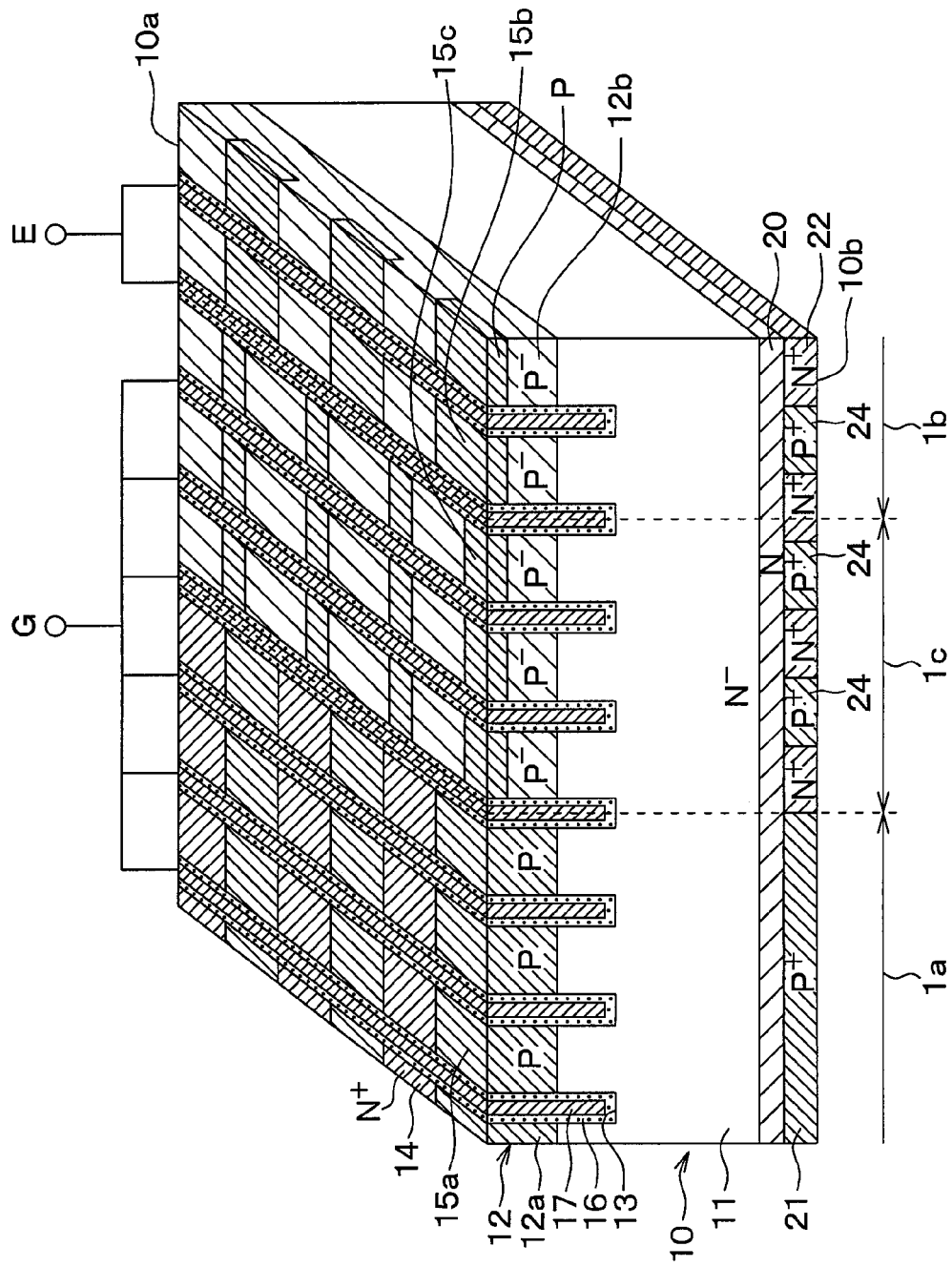
FIG. 9 is a perspective cross-sectional view of a semiconductor substrate composing a semiconductor device according to a fourth embodiment.

As illustrated in FIG. 9, in the present embodiment, a P-type discrete layer 24 partially formed by a P-type impurity layer is formed on the side of the second surface 10b in the diode region 1b and the boundary region 1c. The P-type discrete layer 24 is extended along the longitudinal direction of the trench 13, and a plurality thereof are arranged at regular intervals. The P-type impurity concentration of P-type discrete layer 24 is optional, but when formed simultaneously with the collector layer 21, it becomes the same concentration as that of the collector layer 21.

In this manner, the P-type discrete layer 24 can be also formed in the diode region 1b and the boundary region 1c. Forming such a P-type discrete layer 24 makes it possible to make holes implanted from the high concentration P-type layer on the side of the first surface 10a of the IGBT region 1a to be disabled carriers when it reaches the P-type discrete layer 24. This makes it possible to further reduce holes, and even when hole implantation cannot be sufficiently suppressed by only forming the boundary region 1c to increase a hole implantation amount, holes can be changed into disabled carriers by the P-type discrete layer 24. This makes it possible to enhance the advantageous effects described in the first embodiment.

Fifth Embodiment

A fifth embodiment will be described. The present embodiment is a modification in which the structure of the side of the first surface 10a in the diode region 1b and the boundary region 1c is changed from that in the first to fourth embodiments, and other structures are same as those in the first to fourth embodiments, so that only the portions different from those in the first to fourth embodiments will be described. Although a case where the structure on the side of the second surface 10b is changed from the structure of the first embodiment is described, the change is also applicable to the structure in the second and the fourth embodiments.

Figure 10:
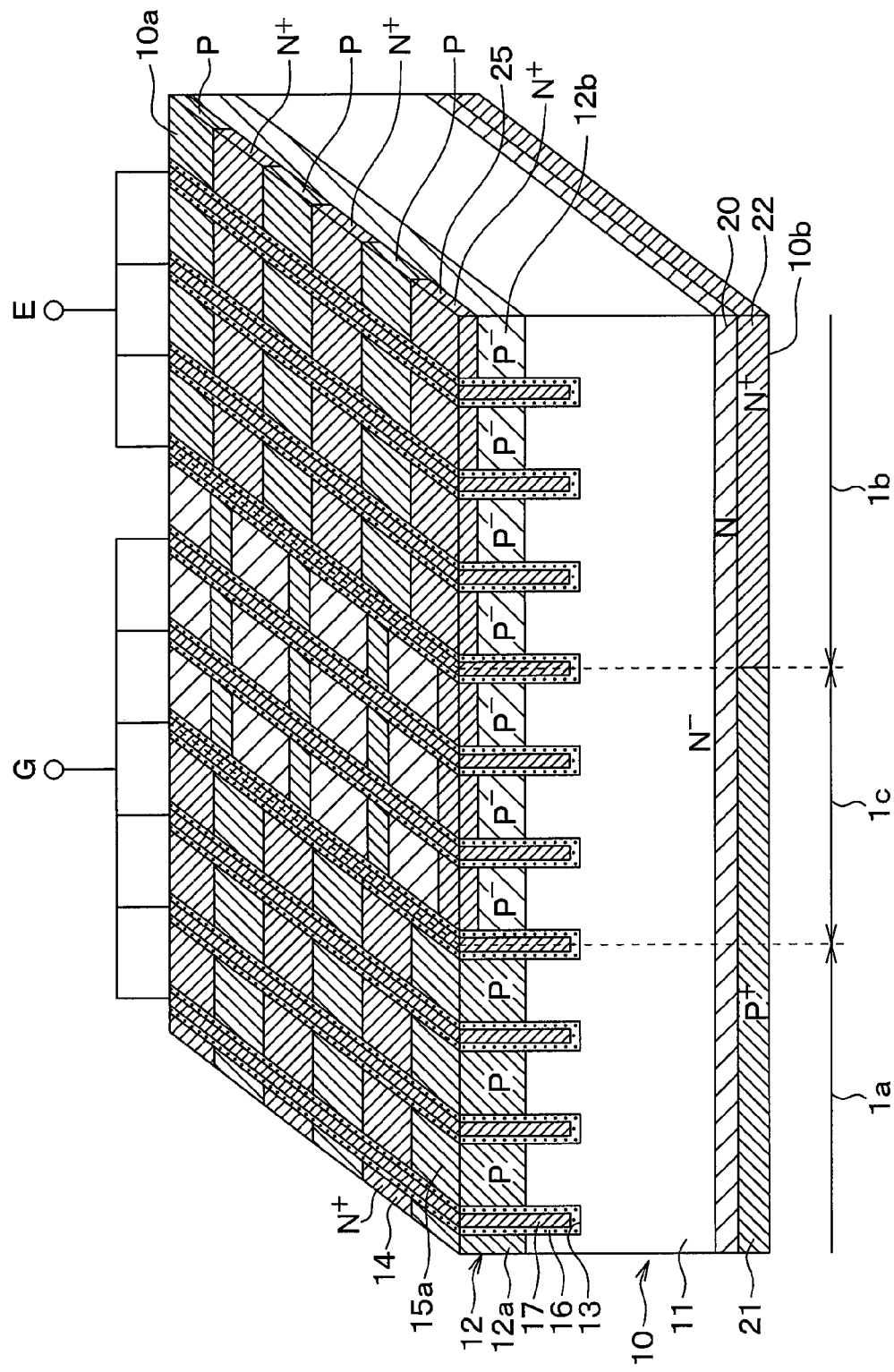
FIG. 10 is a perspective cross-sectional view of a semiconductor substrate composing a semiconductor device according to a fifth embodiment.

As illustrated in FIG. 10, in the present embodiment, an N-type discrete layer 25 formed by an N-type impurity layer is formed on the side of the first surface 10a in the diode region 1b and the boundary region 1c. The N-type discrete layer 25 is formed at, for example, a position different from the second contact region 15b and the third contact region 15c among the surface layer portion of the second base layer 12b. In the case of the present embodiment, the N-type discrete layer 25 is formed at the entire region where no second contact region 15b and no third contact region 15c is formed among the surface layer portion of the second base layer 12b. Although the N-type impurity concentration of the N-type discrete layer 25 is optional, it becomes the same concentration as that in the emitter region 14 when the N-type discrete layer 25 is formed simultaneously with the emitter region 14.

In this manner, forming the N-type discrete layer 25 at the surface layer portion of the second base layer 12b makes it possible to bring the upper electrode 19 and the N-type discrete layer 25 into ohmic contact. That is, in order to reduce switching loss, P-type impurity concentration of the second base layer 12b, the second contact region 15b, and the third contact region 15c in the diode region 1b and the boundary region 1c is desired to be low, but this can cause schottky contact with the upper electrode 19. Forming the N-type discrete layer 25 to be brought into ohmic contact with the upper electrode 19 makes it possible to be in contact with the upper electrode 19 more surely.

Other Embodiments

The present disclosure is described in conformity to the above embodiments, but not limited to the embodiments, and also encompasses various modifications and modifications within the equivalent scope. Additionally, various combinations and modes, and in addition, other combinations and modes of only one component, more, or less thereof are intended to fall within the scope and ideological scope of the present disclosure.

For example, the element structures of the IGBT and the FWD illustrated in the above-mentioned first to fifth embodiments are only examples, and another structure can be employed. Specifically, for the IGBT, although the first base layer 12a is made to function as not only a channel region but also a body region, the first base layer 12a may only function as a channel region, and a body region may be formed in addition to the first base layer 12a. In this case, for example, a structure may be employed in which, in every portion between corresponding two trench gate structures, the emitter region 14 is formed to be in contact with the trench 13, and a body region of P-type is formed on an opposite side of the trench 13 with the emitter region 14 interposed therebetween, that is, at a position away from the trench 13. The surface of the body region forms the first contact region 15a in the first base layer 12a.

In the above-mentioned first to fifth embodiments, although P-type impurity concentrations in the second base layer 12b in the diode region 1b and the boundary region 1c are same, they may be different.

The structures of the IGBT region 1a, the diode region 1b, and the boundary region 1c described in the first to fifth embodiments can be optionally combined. That is, the IGBT region 1a, the diode region 1b, and the boundary region 1c can be combined using the structures of different embodiments. For example, the structure in which the emitter regions 14 are interspersed along the longitudinal direction of the trenches 13 like the first and second embodiments, and the structure in which the second contact region 15b and the third contact region 15c are linearly formed like the third and fourth embodiments may be combined. Inversely, the structure in which the emitter region 14 is linearly formed along the longitudinal direction of the trenches 13 like the third and fourth embodiments, and the structure in which the second contact regions 15b and the third contact regions 15c are interspersed along the longitudinal direction of the trenches 13 like the first embodiment and the second embodiment may be combined.

In the above-mentioned fourth embodiment, the structure is employed in which the P-type discrete layer 24 is extended along the longitudinal direction of the trench 13, but the P-type discrete layer 24 may be formed to have another upper surface layout such as a structure in which the P-type discrete layer 24 are interspersed into a desired pattern.

Although the emitter region 14 is formed in every first base layer 12a between corresponding two adjacent trench gate structures of the IGBT, a thinning structure in which no emitter region 14 is formed to form no channel may be employed. A hole barrier layer may be formed in the first base layer 12a at a portion where no channel is formed as a thinning structure.

In each of the above embodiments, although the description is made as an example using the semiconductor device provided with the IGBT of n channel type in which its first conductivity type is n-type and its second conductivity type is p-type, the IGBT of p channel type may be employed in which the conductivity type of each constituent element is inverted.

The invention claimed is:

1. A semiconductor device comprising:
a semiconductor substrate having an IGBT region provided with an IGBT, a diode region provided with a diode, and a boundary region arranged between the IGBT region and the diode region, the semiconductor substrate including
a first conductivity type drift layer,
a second conductivity type base layer arranged at a surface layer portion of the drift layer,
a second conductivity type collector layer arranged on a side of the drift layer opposite to the base layer in the IGBT region and the boundary region, and
a first conductivity type cathode layer arranged on the side of the drift layer opposite to the base layer in the diode region;
a trench gate structure including a plurality of trenches arranged in the IGBT region, the diode region, and the boundary region, wherein each of the trenches has a gate insulating film and a gate electrode, the each of the trenches has one direction as a longitudinal direction and is deeper than the base layer, and the trenches divide the base layer into a plurality of base layer portions;
a first conductivity type emitter region arranged in at least a part of a first base layer to be in contact with any of the plurality of trenches, the first base layer being the base layer in the IGBT region;
a first contact region arranged at a portion of the first base layer different from the emitter region;
a second conductivity type second contact region arranged at a surface layer portion of a second base layer in the diode region, the second contact region having a higher second conductivity type impurity concentration than the second base layer, the second base layer being the base layer in the diode region and the boundary region;
a second conductivity type third contact region arranged at the surface layer portion of the second base layer in the boundary region, the third contact region having a higher second conductivity type impurity concentration than the second base layer;
an upper electrode electrically connected to the first contact region, the second contact region, the third contact region, and the emitter region; and
a lower electrode electrically connected to the collector layer and the cathode layer, wherein
a formation area of the third contact region is smaller than a formation area of the second contact region per unit area of a surface of the semiconductor substrate.

2. A semiconductor device comprising:
a semiconductor substrate having an IGBT region provided with an IGBT, a diode region provided with a diode, and a boundary region arranged between the IGBT region and the diode region, the semiconductor substrate including
a first conductivity type drift layer,
a second conductivity type base layer arranged at a surface layer portion of the drift layer,
a second conductivity type collector layer arranged on a side of the drift layer opposite to the base layer in the IGBT region,
a first conductivity type cathode layer arranged on the side of the drift layer opposite to the base layer in the diode region and the boundary region, and
a second conductivity type discrete layer partially arranged in the cathode layer;
a trench gate structure including a plurality of trenches arranged in the IGBT region, the diode region, and the boundary region, wherein each of the trenches has a gate insulating film and a gate electrode, the each of the trenches has one direction as a longitudinal direction and is deeper than the base layer, and the trenches divide the base layer into a plurality of base layer portions;
a first conductivity type emitter region arranged in at least a part of a first base layer to be in contact with any of the plurality of trenches, the first base layer being the base layer in the IGBT region;
a first contact region arranged at a portion of the first base layer different from the emitter region;
a second conductivity type second contact region arranged at a surface layer portion of a second base layer in the diode region, the second contact region having a higher second conductivity type impurity concentration than the second base layer, the second base layer being the base layer in the diode region and the boundary region;
a second conductivity type third contact region arranged at the surface layer portion of the second base layer in the boundary region, the third contact region having a higher second conductivity type impurity concentration than the second base layer;
an upper electrode electrically connected to the first contact region, the second contact region, the third contact region, and the emitter region; and
a lower electrode electrically connected to the collector layer and the cathode layer, wherein
a formation area of the third contact region is smaller than a formation area of the second contact region per unit area of a surface of the semiconductor substrate.

3. The semiconductor device according to claim 1, wherein
the gate electrode arranged in the boundary region has an electrical potential equal to an electrical potential of the gate electrode arranged in the IGBT region.

4. The semiconductor device according to claim 1, wherein
the gate electrode arranged in the boundary region has an electrical potential equal to an electrical potential of the gate electrode arranged in the diode region.

5. The semiconductor device according to claim 1, wherein:
the first base layer arranged in the IGBT region has a higher second conductivity type impurity than the second base layer arranged in the diode region and the boundary region; and
the first contact region is configured by a surface of the first base layer, and the first base layer functions as a channel region for forming a channel and also functions as a body region.

6. The semiconductor device according to claim 1, wherein
a plurality of the emitter regions are arranged along the longitudinal direction between adjacent two of the trenches and in contact with corresponding side surfaces of the adjacent two of the trenches.

7. The semiconductor device according to claim 1, wherein the emitter region is extended along the longitudinal direction of the trenches between adjacent two of the trenches.

8. The semiconductor device according to claim 1, wherein:
   the second base layer divided by the trenches includes a plurality of second base layer portions in the diode region and the boundary region;
   the second contact region is extended along the longitudinal direction between adjacent two of the trenches in the diode region;
   the third contact region is extended along the longitudinal direction between adjacent two of the trenches in the boundary region;
   the second contact region is arranged in each of the second base layer portions; and
   the third contact region is arranged at a rate of one in every plurality of the second base layer portions.

9. The semiconductor device according to claim 8, wherein:
   a formation pitch that is an interval at which the third contact region is arranged is stepwisely changed toward the diode region from the IGBT region; and
   the formation pitch gradually decreases toward the diode region from the IGBT region.

10. The semiconductor device according to claim 1, wherein:
    a first conductivity type discrete layer is arranged at a portion of the surface layer portion of the second base layer different from the second contact region and the third contact region; and
    the upper electrode is in an ohmic contact with the first conductivity type discrete layer.

\* \* \* \* \*